US006573661B2

(12) United States Patent
Fowlkes et al.

(10) Patent No.: US 6,573,661 B2
(45) Date of Patent: Jun. 3, 2003

(54) IMAGE DISPLAY FOR DISPLAYING A REFLECTION IMAGE AND A LUMINOUS IMAGE

(75) Inventors: William Y. Fowlkes, Pittsford, NY (US); Lee W. Tutt, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 09/879,774

(22) Filed: Jun. 12, 2001

(65) Prior Publication Data

US 2002/0187365 A1 Dec. 12, 2002

(51) Int. Cl.⁷ .............................. G09G 3/10; H01J 29/10
(52) U.S. Cl. ..................................... 315/169.3; 313/461
(58) Field of Search ........................... 315/169.3, 169.4; 313/461, 463; 345/723, 80, 87, 102

(56) References Cited

U.S. PATENT DOCUMENTS 5,706,061 A * 1/1998 Marshall et al. ............ 348/742
5,940,204 A * 8/1999 Hewlett ...................... 353/121
5,999,173 A * 12/1999 Ubillos ....................... 345/724
6,094,294 A * 7/2000 Yokoyama et al. ........... 353/30
6,118,458 A * 9/2000 Kawai et al. ................ 345/473
6,157,373 A * 12/2000 Rego ........................... 345/173
6,190,827 B1   2/2001 Weidner ...................... 430/201
6,208,364 B1   3/2001 Tutt et al. ................... 347/176
6,239,068 B1   5/2001 Tutt et al. ................... 503/201
6,245,393 B1 * 6/2001 Thompson et al. ......... 427/256
6,288,828 B1 * 9/2001 Hewlett ...................... 353/121
6,300,924 B1 * 10/2001 Markandey et al. ......... 345/84

* cited by examiner

*Primary Examiner*—Don Wong
*Assistant Examiner*—Minh D A
(74) *Attorney, Agent, or Firm*—Thomas H. Close

(57) ABSTRACT

An image display device, including: a luminous display having a light emitting face for providing a luminous image; and a reflective image in a screen pattern located on the light emitting face, whereby when the luminous display is emitting light, the luminous image dominates, and when the luminous display is not emitting light the reflective image dominates.

23 Claims, 3 Drawing Sheets

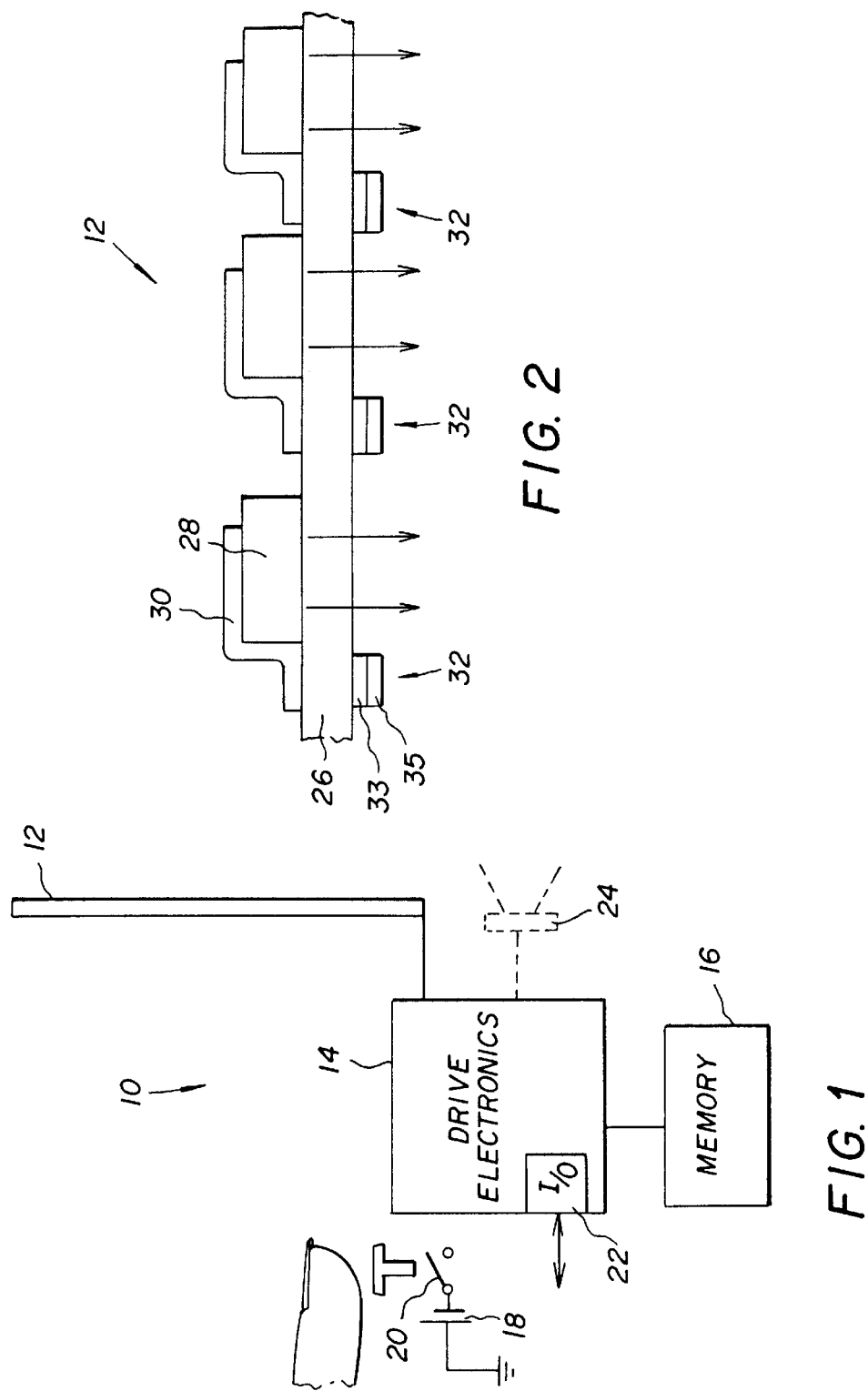

IMAGE DISPLAY FOR DISPLAYING A REFLECTION IMAGE AND A LUMINOUS IMAGE

FIELD OF THE INVENTION

The present invention relates to image display devices, and more particularly to an image display device that displays a reflection image and a luminous image.

BACKGROUND OF THE INVENTION

It is known to provide luminous image displays that emit light in an imagewise pattern from an array of light emitting elements. Examples of imagewise addressable luminous displays are CRT's, organic light emitting diode (OLED) displays and plasma displays. It is also known to provide luminous image displays that employ a non imagewise light source, located behind an imagewise light modulator. Examples of such non imagewise light source luminous displays include fixed displays such as back lit photographic transparencies, and addressable displays such as back lit liquid crystal displays.

It is also known to provide an electronic image display device tailored specifically for displaying digital still images. An example is the Kodak Smart Picture Frame that includes a digital camera card reader, full-color display and modem. The Kodak Smart Picture Frame can display a single image or sequentially cycle through up to 36 separate fall-color digital pictures. The user inserts a COMPACT-FLASH memory card from a digital camera to display and view images on the frame. Using a built-in slide show function, pictures can be sequentially displayed for an ever-changing display. The frame owner can select how long a given image is displayed—from 5 seconds to a full day. The frame can double as an information appliance, delivering news, weather, traffic, fine art and other information.

One drawback of such luminous displays is that they need to be continuously powered to display the images. If powered by line current, they are not completely portable. If powered by batteries, they rather quickly deplete the batteries, requiring inconvenient recharging or expensive battery replacement.

When the power to an addressable image wise luminous display is turned off to save energy and or save the lifetime of the battery or the device itself, a flat uniform appearance is generally presented. When the power to a non image wise light source luminous display (e.g. a backlit transparency) is turned off, such as during the day, an image of poor quality can result.

There is a need therefore for a luminous display device that does not require continuous power, but which can display a good quality image when the power is turned off.

SUMMARY OF THE INVENTION

The need is met according to the present invention by providing an image display device that includes: a luminous display having a light emitting face for providing a luminous image; and a reflective image in a screen pattern located on the light emitting face, whereby when the luminous display is emitting light, the luminous image dominates, and when the luminous display is not emitting light the reflective image dominates. In one embodiment of the invention, the luminous image is a motion image sequence and the content of the reflection image is related to the content of the luminous image.

ADVANTAGEOUS EFFECT OF THE INVENTION

The advantage of this invention is that the when an emitting device is not powered, a static image can be seen in reflection in contrast to the uniform blank images provided with standard display devices. The content of the reflection image can be related to the content of the luminous image.

BRIEF DESCRIPTION OF THE DRAWINGS

FIG. 1 is a schematic diagram showing a display device according to the present invention;

FIG. 2 is a cross sectional view of a portion of the display screen having a shadow mask image according to the present invention;

DETAILED DESCRIPTION OF THE INVENTION

Figure 4:
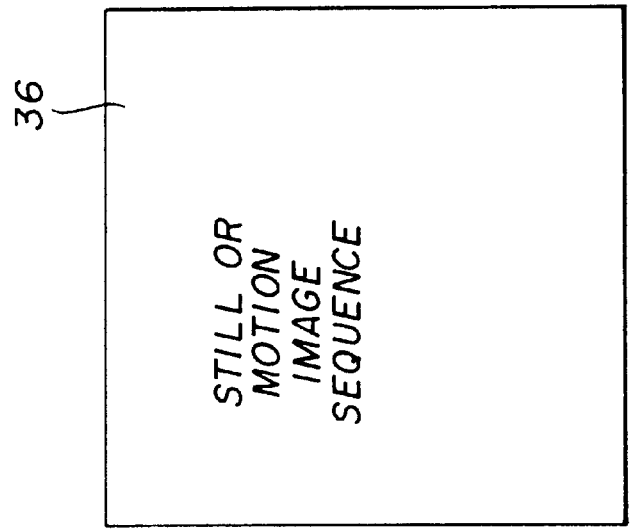
FIG. 4 is a schematic diagram representing an image motion sequence displayed on the display device of the present invention.

In luminous display devices, often only a portion of the image area emits light. In some devices, light emitting pixel elements are separated from adjacent pixels by region which include electrical lines and transistors necessary for operation of the pixels in the device. This region can be a significant fraction of the total area (e.g. >50%) of the luminous display. These non light emitting regions are not visible when the device is in operation because when the luminous display is emitting light, the luminous image dominates. When the luminous display is turned off, these non light emitting regions are featureless and not visually appealing.

According to the present invention, a reflective image is placed over these non light emitting regions. In this manner when the luminous display is turned on, the emitted light is much greater than the ambient light reflected from the reflective image and the luminance image dominates. When the luminous display is turned off, the reflected light from the reflective image dominates.

In a similar manner, a continuous luminous image such as a backlit transparency image can be provided with a reflective image that covers only a portion of the transparency in a screen pattern, such that when the backlight is on the transparency image predominates, but when the backlight is turned off the reflective image predominates.

To produce a luminous display device according to the present invention, a conventional luminous display, such as an OLED display, backlit liquid crystal display (LCD), cathode ray tube (CRT), or backlit transparency is manufactured and then a static reflective image is applied in a screen pattern to the light emitting surface of the display, for example by laser dye transfer, thermal transfer, electrophotography, inkjet, or other high resolution printing technique well known in the art. The reflective image is applied in a regular pattern such that the printed region covers more than 10% of the available image area. Preferably, the reflective image is located over non light emitting portions such as circuitry of the luminous display.

Referring to FIG. 1, an image display device 10 according to one embodiment of the present invention, includes a luminous display such as an organic light emitting diode (OLED) display 12. Drive electronics 14 are connected to the luminous display 12 to drive the display to cause it to display a still image or a motion image segment. A memory 16 for holding digital image data representing the still or motion image segment is connected to the drive electronics 14. A power supply 18, preferably a battery, is connected to power the components of the display device 10 through a switch 20 that can be activated to temporarily apply power to the drive electronics to cause the luminous display to display the still or motion image sequence. An input/output port 22, such as USB port is provided for supplying the digital image data to the memory 16. Optionally, a speaker 24 can be connected to the drive electronics to produce an audio clip to accompany the displayed image.

Figure 3A:
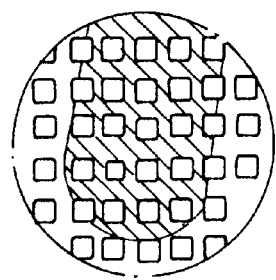
FIG. 3 is a plan view of a shadow mask having a permanent image formed thereon according to the present invention.
Figure 3:
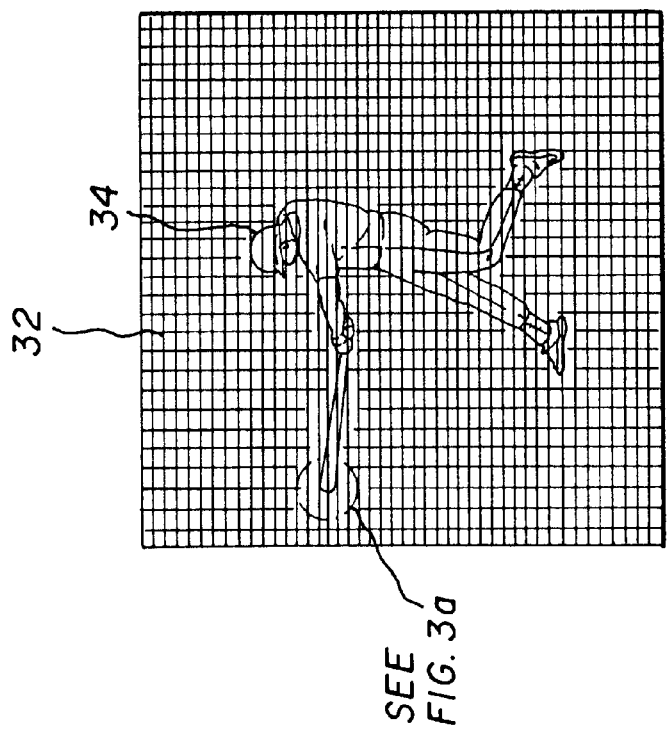

Referring to FIG. 2, in one embodiment, the luminous display 12 is an organic light emitting diode (OLED) display that includes a transparent substrate 26. An array of organic light emitting elements 28 and conductors 30 for powering the organic light emitting elements 28 are arranged on one side of the substrate 26. The other side of the substrate is provided with a light reflective screen 32 that covers the regions between the light emitting elements 28. The light reflective screen includes a reflective base layer 33, such as a white pigment, covered by a color layer 35. Referring to FIG. 3, an image 34 is formed by the color layer 35 on the light reflective screen 32. The image 34 is clearly visible when the display device 10 is not powered. A detail of a portion of the image is shown in the inset 3a of FIG. 3.

Referring to FIG. 4, when the display device 10 is powered by depressing switch 20, a still or motion image sequence 36 is presented on the display device corresponding to the still or motion image sequence that is stored in memory 16. The light from the display device swamps the image 34, and the still or motion image sequence 36 is predominate.

According to an alternative embodiment of the present invention, the memory 16 may contain an audio clip related to the motion image sequence, and the audio clip is played on speaker 24 when the video clip is displayed.

The luminous display can also be an OLED device of the type that emits light from the same side of the display on which the light emitting elements are located. In this case, the reflective screen 32 with image 34 is formed on top of the light emitting surface of the display. This same arrangement can be used with a back lit liquid crystal display, or a back lit transparency. In the case of the transparency, the screen does not obscure any electronics, and may therefore be any perforated pattern that covers at least 10% of the display area.

The two following examples were prepared to demonstrate the concept of a regular reflection image over a luminance image.

EXAMPLE 1

Figure 5:
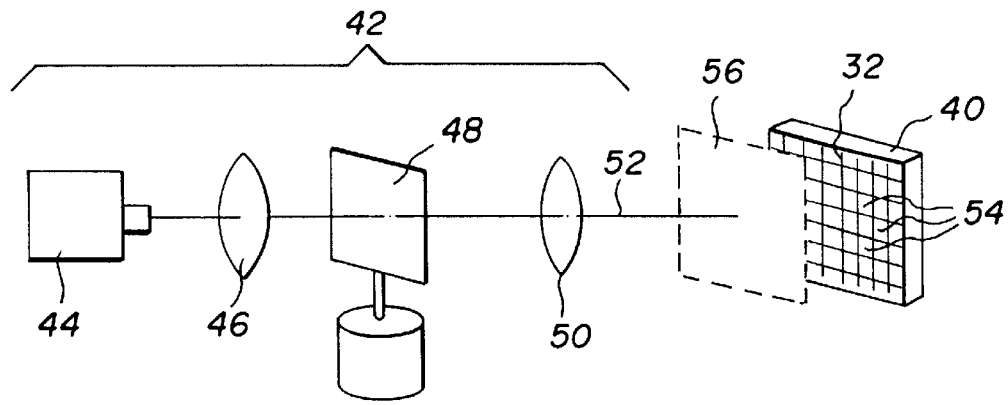
FIG. 5 is a schematic diagram showing a laser writer for making one embodiment of a reflective screen used with the present invention.

Referring to FIG. 5, the reflective screen pattern 32 was formed on a substrate 40 using a laser writer 42 having a single laser 44, which was focussed and scanned across a donor/receiver composite. Specifically, an SDL, Inc 1-watt diode laser (model 5400 C-mount laser) was used as the laser source 44. This diode laser has a nominal operating wavelength of 830 NM. The output beam was shaped and oriented by beam shaping optics 46, reflected off a scanning galvanometer 48, and imaged on the substrate 40 through an F-theta lens 50. All optics were antireflective coated for 830 NM to reduce power loss. The output beam 52 of the laser 44 was imaged onto the substrate 40 to yield a spot that was approximately 17 micron by 80 microns full width half minimum (FWHM). The scanning galvanometer 48 scans the beam 52 such that the long axis of the spot is always parallel to the scan. The galvanometer 48 and F-theta lens 50 combination was constructed to give 3.5 inches of scan.

A substrate comprising a 104 micron film of polyethylene terephthalate was coated with nickel to an optical transmission density of 1.3. The laser writer 42 was used to ablate the nickel leaving clear spaces 54, which were 70 microns wide separated by untouched metal stripes 90 microns wide.

A white donor sheet 56 was prepared as taught in U.S. Pat. No. 6,190,827 issued Feb. 20, 2001 to Weidner, by coating a transparent support with a hydrophilic layer, a propellant layer comprising a gas producing polymer, and a colorant layer having a white pigment and an optical brightener. The white donor sheet was placed in contact with the metal lined side of the substrate 40. The laser writer 42 was then used to transfer a white coating in registration with the metal lines on the substrate 40. The resulting substrate with screen had a whitish-gray appearance when illuminated from the side having the screen and transparent when illuminated from the opposite side.

A color image was then transferred to the screen using colored dye donor elements having a support with an image dye in an infra-red absorbing binder of the type described in U.S. Pat. No. 6,208,364 issued Mar. 27, 2001 to Tutt et al. The dye donor elements were placed in registration with the support 50 and a color image was transferred using the laser writer 42 onto the reflective screen 32 centered on the white lines and about 45 microns in width.

Figure 6:
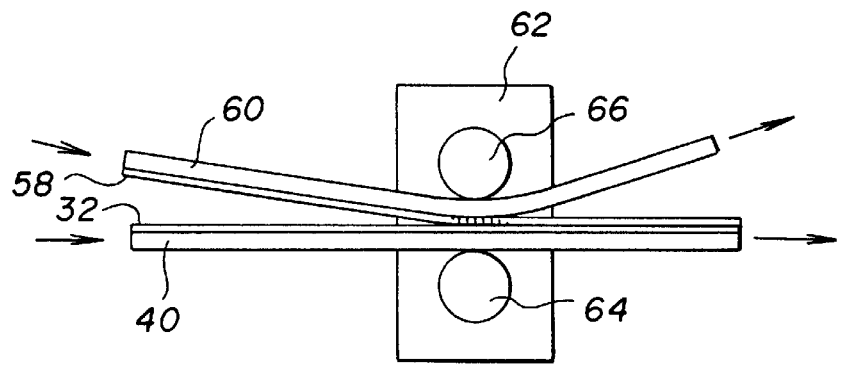
FIG. 6 is a schematic diagram showing a lamination step used in the manufacture of a reflective screen used with one embodiment of the present invention.

Referring to FIG. 6, a transparent transfer laminate 58 coated on a carrier 60 was then applied to the support 40 over reflective image screen 32 by thermal transfer as detailed in U.S. Pat. No. 6,239,068 issued May 29, 2001 to Tutt et al. The transfer laminate carrier 60 was a 36 micron thick sheet of poly (ethylene terephthalate). Onto this carrier 60 was coated a layer containing 0.82 g/m2 polyvinylbutyral (Butvar® 76, Monsanto Co.) and 0.02 g/m2 Fluorad FC 431® surfactant (3M Co). An adhesive layer was then coated over this layer consisting of 3.3 g/m2 of a sodium polyacrylate polymer (AQ55D, Eastman Chemical Co., Tennessee), 0.02 g/m2 of Olin 10 G (Olin Corp., Norwalk, Conn.) surfactant, 0.02 g/m2 of FT248 (Bayer Co., Germany) surfactant, and 0.02 g/m2 of Triton X 200E (Union Carbide Corp., Charleston, W. Va.) surfactant.

Lamination of the protective material was effected by passing the substrate 40 with the reflective screen image 32 and carrier 60 with transfer laminate 58 through a laminator. The laminator 62 was a modified GMP Co. LTD (Kyoungki-Do, Korea) laminator model Passport 175LSI. The modification was to adjust the gap thickness to about a 1270 micron gap and disabling heating in the lower roller 64. Lamination was conducted at 133 C. and a feed rate of 0.36 cm/sec. The transfer laminate was placed adhesive side to image side and the reverse side in contact with the heated roller 66. Upon exiting the laminator 62 the 36 micron polyethylene terephthalate carrier 60 was peeled off and discarded. The lamination operation fused the dyes into the transfer laminate 58 and served to protect the image.

Figure 7:
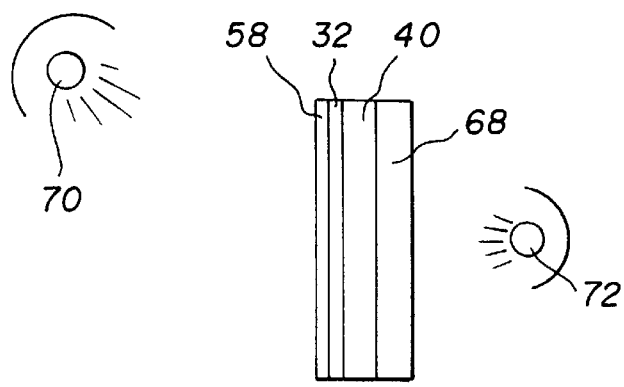
FIG. 7 is a schematic side view of a display device according to one embodiment of the present invention.

Referring to FIG. 7, the resulting reflective image on substrate 40 was placed in front of an image transparency 68 to form a display device according to one embodiment of the present invention. Under front lighting conditions from lamp 70, with no back lighting, the reflective image predominated and was the only one visible. When transparency was illuminated from the rear by lamp 72, the transparency image predominated and only the image in the transparency 68 was visible.

EXAMPLE 2

According to this example, a support with a reflective screen image was generated as in Example 1. Next, a second unpatterned transparency color image was produced on the reverse side of the substrate 40 using the laser writer 42 and three subtractive color cyan, magenta and yellow (CMY) dye donors to sequentially write the unpatterned color image onto the reverse side of the substrate 40. A clear laminate was then applied, as described above to this unpatterned color image on the back side of the support.

When the support with the unpatterned transparency image on the back, and the reflective image on the front was illuminated from the front, the reflective image predominated and only the reflective image was visible. When support was illuminated from the backside, the transparency image predominated and only the transparency image was visible.

The invention has been described in detail with particular reference to certain preferred embodiments thereof, but it will be understood that variations and modifications can be effected within the spirit and scope of the invention.

Parts List

10 display device
12 luminous display
14 drive electronics
16 memory
18 power supply
20 switch
22 I/O port
24 speaker
26 transparent substrate
28 OLED element
30 conductor
32 reflective screen
33 reflective base layer
34 image on screen
35 color layer
36 motion image sequence
40 substrate
42 laser writer
44 laser
46 beam shaping optics
48 scanning galvanometer
50 F-theta lens
52 output beam
54 clear spaces
56 white donor sheet
58 transparent laminate
60 laminate carrier
62 laminator
64 lower laminator roller
66 heated roller
68 transparency
70 front lamp
72 rear lamp

What is claimed is:

1. An image display device, comprising:
   a) a luminous display having a light emitting face for providing a luminous image; and
   b) a reflective image in a screen pattern located on the light emitting face, whereby when the luminous display is emitting light, the luminous image dominates, and when the luminous display is not emitting light the reflective image dominates.

2. The image display device of claim 1, wherein the luminous display is a backlit transparency, and the reflective image is formed on the light emitting face of the transparency.

3. The image display device of claim 1, wherein the luminous display is an OLED display having non light emitting portions interspersed with light emitting elements and the screen pattern of the reflective image is located over these non light emitting portions.

4. The image display device claimed in claim 3, wherein the OLED display is a color display.

5. The image display device claimed in claim 3, wherein the OLED display includes a transparent substrate, the OLED display emitting light through the substrate.

6. The image display device claimed in claim 1, further comprising:
   c) a memory containing a digital image;
   d) display drive electronics connected to the display and the memory for driving the display to show the digital image; and
   e) a power source connected to the display drive electronics.

7. The image display device claimed in claim 6, wherein the content of the luminance image is related to the content of the reflective image.

8. The image display device claimed in claim 6, wherein the power source is a battery.

9. The image display device claimed in claim 6, wherein the memory includes an audio clip associated with the digital image, and further including a speaker connected to the display electronics for playing the audio clip in concert with the display of the digital image.

10. The image display device claimed in claim 6, wherein the digital image is a motion image sequence.

11. The image display device claimed in claim 1, wherein the screen pattern comprises a layer of reflective metal covered by a layer of reflective white material, covered by a layer of colored material.

12. The image display device claimed in claim 1, wherein the luminous display is a backlit LCD.

13. A method of making an image display, comprising the steps of:
   a) providing a luminous display having a light emitting face for providing a luminous image; and
   b) forming a reflective image in a screen pattern located on the light emitting face, whereby when the luminous display is emitting light, the luminous image dominates, and when the luminous display is not emitting light the reflective image dominates.

14. The method of claim 13, wherein the luminous display is a backlit transparency, and the reflective image is formed on the light emitting face of the transparency.

15. The method of claim 13, wherein the luminous display is an OLED display having non light emitting portions interspersed with light emitting elements, and the screen pattern of the reflective image is formed over these non light emitting portions.

16. The method of claim 15, wherein the OLED display is a color display.

17. The method of claim 15, wherein the OLED display includes a transparent substrate, the OLED display emitting light through the substrate.

18. The method of claim 13, further comprising the steps of:
  c) providing a memory containing a digital image;
  d) providing a display drive electronics connected to the display and the memory for driving the display to show the digital image; and
  e) providing a power source connecting the display drive electronics.

19. The method of claim 18, wherein the content of the luminance image is related to the content of the reflective image.

20. The method of claim 18, wherein the power source is a battery.

21. The method of claim 18, wherein the memory includes an audio clip associated with the digital image, and further comprising the step of including a speaker connected to the display electronics for playing the audio clip in concert with the display of the digital image.

22. The method of claim 18, wherein the digital image is a motion image sequence.

23. The method of claim 13, wherein the luminous display is a backlit LCD.

* * * * *